(12) United States Patent
Funakoshi et al.

(10) Patent No.: US 7,547,966 B2
(45) Date of Patent: Jun. 16, 2009

(54) POWER SEMICONDUCTOR MODULE

(75) Inventors: Sunao Funakoshi, Kasumigaura (JP);
Katsumi Ishikawa, Hitachinaka (JP);
Tasao Soga, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 54 days.

(21) Appl. No.: 11/873,454

(22) Filed: Oct. 17, 2007

(65) Prior Publication Data

US 2008/0224303 A1 Sep. 18, 2008

(30) Foreign Application Priority Data

Oct. 18, 2006 (JP) .............................. 2006-283547
Jul. 11, 2007 (JP) .............................. 2007-181706

(51) Int. Cl.
*H01L 23/34* (2006.01)
*H01L 23/10* (2006.01)
*H01L 23/367* (2006.01)
*H01L 23/427* (2006.01)

(52) U.S. Cl. ...................... 257/707; 257/706; 257/720; 257/722; 257/E23.105; 257/E23.088

(58) Field of Classification Search ................ 257/706, 257/707, 720, 722, E23.088, E23.105
See application file for complete search history.

(56) References Cited

U.S. PATENT DOCUMENTS 6,703,707 B1 * 3/2004 Mamitsu et al. ............. 257/718
6,845,012 B2 * 1/2005 Ohkouchi .................... 361/704
7,027,302 B2 * 4/2006 Inoue .......................... 361/699
7,145,254 B2 * 12/2006 Hirano et al. ............... 257/796

FOREIGN PATENT DOCUMENTS

JP 2005-175130 6/2005
JP 2007-251076 9/2007

OTHER PUBLICATIONS

U.S. Appl. No. 11/657,458, filed Jan. 25, 2007, Hitachi, Ltd.

* cited by examiner

*Primary Examiner*—Luan C Thai
(74) *Attorney, Agent, or Firm*—Antonelli, Terry, Stout & Kraus, LLP.

(57) ABSTRACT

A power semiconductor module with its thermal resistance and overall size reduced. Insulating substrates with electrode metal layers disposed thereon are joined to both the surfaces of a power semiconductor chip by using, for example, soldering. Metal layers are disposed also on the reverse surfaces of the insulating substrates and the metal layers are joined to the heat spreaders by using brazing. Heat radiating fins are provided on the heat radiating surface of at least one of the heat spreaders. The heat radiating side of each of the heat spreaders is covered by a casing to form a refrigerant chamber through which refrigerant flows to remove heat transmitted from the semiconductor chip to the heat spreader.

21 Claims, 12 Drawing Sheets

V-V CROSS-SECTION

VI-VI CROSS-SECTION

X-X CROSS-SECTION

XI-XI CROSS-SECTION

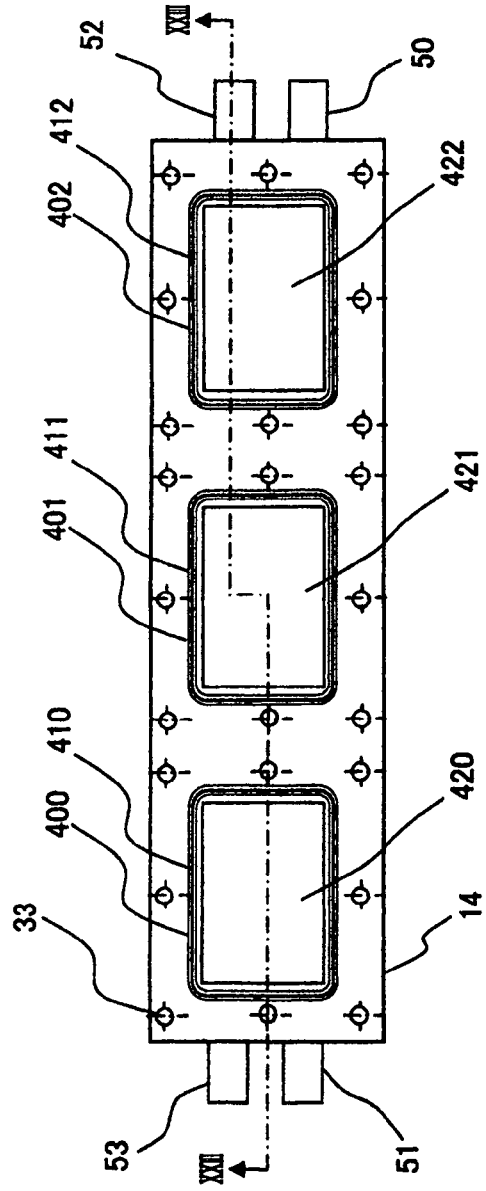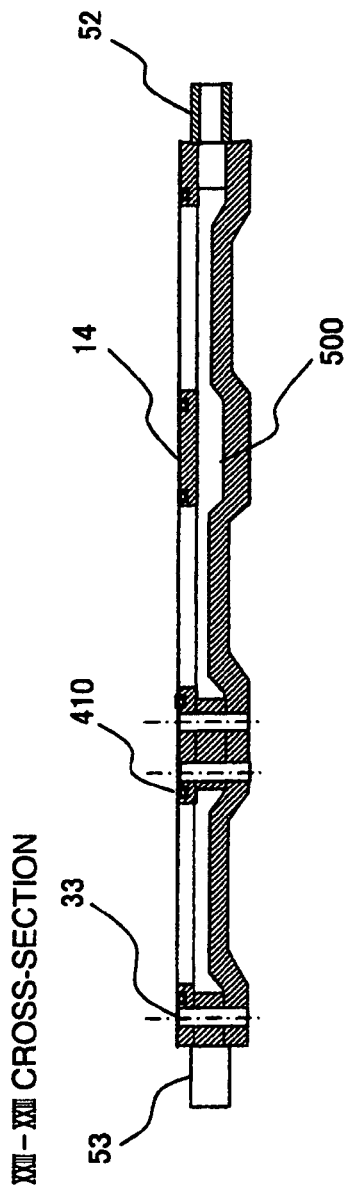

XXV – XXV CROSS-SECTION

POWER SEMICONDUCTOR MODULE

CROSS-REFERENCE TO RELATED APPLICATION

This application relates to subject matter described in application Ser. No. 11/657,458 filed on Jan. 25, 2007 entitled "POWER SEMICONDUCTOR MODULE" by Sunao Funakoshi, Katsumi Ishikawa and Tasao Soga, and assigned to the same assignee of this application.

BACKGROUND OF THE INVENTION

This invention relates to a power semiconductor module.

Recently, a demand has been increasing for an inverter capable of operating at high power and being mounted on a hybrid automobile. Accordingly, it is necessary for power modules constituting such an inverter to be capable of high power operation. Usually, in an automobile, the space for accommodating its constituent parts is limited, that is, should be as small as possible. Therefore, the size of such a power module should preferably be minimized. Thus, in order to attain both high power operation and size reduction, it is vital to enhance the refrigerating (cooling) capability for the power module. One of the conventional techniques for enhancing the refrigerating performance of power module is disclosed in JP-A-2005-175130, wherein an electrode, an insulating sheet, a heat spreader, and a heat sink are provided on either side of a power semiconductor chip so that heat radiation or refrigeration may take place on both (upper and lower) sides of the power semiconductor chip.

SUMMARY OF THE INVENTION

In the above mentioned structure, the provision of the heat sinks on both sides of the power semiconductor chip indeed enhances the refrigerating performance, but a problem of large thermal resistance cannot be eliminated since the electrode, the insulating sheet, the heat spreader and the heat sink are not soldered to one another but are simply fixed to one another with conductive resin.

This invention has been made to solve the above mentioned problem and aims to provide a power semiconductor module having a high performance in heat radiation or refrigeration.

A power semiconductor module according to this invention comprises a first insulating substrate whose surface is joined to a first principal surface of a power semiconductor chip and a second insulating substrate whose surface is joined to a second principal surface of the power semiconductor chip, with metal layers adhered to the rear surfaces of the first and second insulating substrates. A heat radiating structure consisting mainly of a heat spreader, a heat sink and a heat pipe is provided on each of the rear surfaces of the first and second insulating substrates. The heat radiating structure is brazed to the metal layer provided on each of the rear surfaces of the first and second insulating substrates so as to be joined to the insulating substrates.

According to this invention, a high refrigerating capability can be achieved since the thermal resistance between the power semiconductor chip and the refrigerating means such as a heat spreader can be considerably reduced by joining the refrigerating means such as heat spreaders to the insulating substrates attached on both surfaces of the power semiconductor chip, by using soldering or brazing.

Other objects, features and advantages of the invention will become apparent from the following description of the embodiments of the invention taken in conjunction with the accompanying drawings.

BRIEF DESCRIPTION OF THE DRAWINGS

FIG. 22 schematically shows in plan the structure of a casing for forming the refrigerant channels used for power semiconductor module as the sixth embodiment of this invention;

FIG. 23 is a cross section taken along line XXIII-XXIII in FIG. 22 showing in plan the structure of the casing;

DESCRIPTION OF THE EMBODIMENTS

The embodiments of this invention will now be described with reference to the attached drawings.

Embodiment 1

Figure 1:
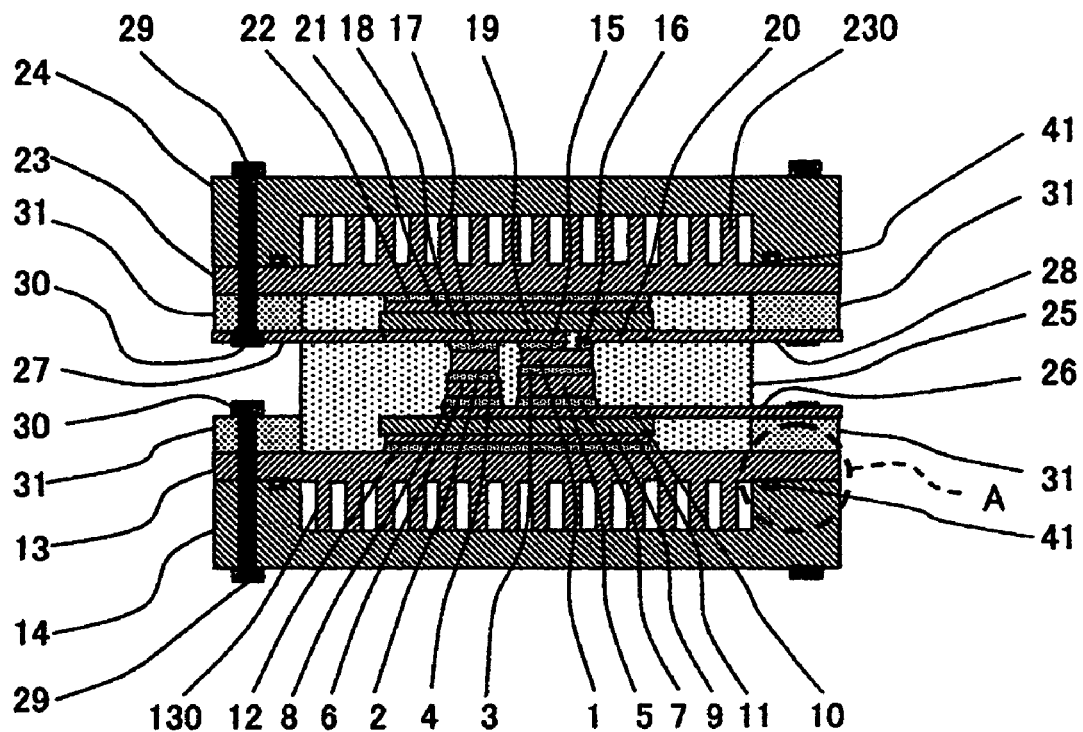
FIG. 1 schematically shows in vertical cross section a power semiconductor module as a first embodiment of this invention.

FIG. 1 schematically shows in vertical cross section a power semiconductor module as a first embodiment of this invention. The power semiconductor module shown in FIG. 1 incorporates therein power semiconductor chips 1, 2 such as insulated gate bipolar transistors (IGBTs) or freewheel diodes. The lower surfaces of the power semiconductor chips 1, 2 are joined to spacers 5, 6 with first joining material layers 3, 4 such as solder in between, respectively.

The spacers 5, 6 serve to adjust the overall thicknesses of the power semiconductor chips 1, 2 when they are different in thickness from each other. The spacers 4, 5 also serve to prevent electric discharge from taking place between the electrodes 28, 26 provided respectively on the upper and the lower sides of the power semiconductor chip as the insertion of the spacers increases the distance between the electrodes 26, 28. The spacers should preferably have small electric and thermal resistances. Copper, composite material of copper and carbon, or joint metal of copper and invar can be used for the spacers. When the composite material of copper and carbon, or the joint metal of copper and invar, both of which have a thermal expansion coefficient smaller than that of copper, is used, the strain in the solder layer due to the thermal deformation is reduced and the reliability in performance is improved. Concretely, the thermal expansion coefficient of the composite material of copper and carbon is about $6 \times 10^{-6}$/K, which is smaller than $17 \times 10^{-6}$/K for copper.

A lower insulating substrate 9 is made of, for example, aluminum nitride AlN, alumina $Al_2O_3$, silicon nitride $Si_3N_4$, or boron nitride BN. Copper (or aluminum) sheets 10, 11 are previously joined directly to both the surfaces of the substrate 9. The lower surfaces of the spacers 5, 6 are joined to copper sheet 10 serving as an electrode metal layer disposed on the upper surface of the lower insulating substrate 9, with second joining material layers 7, 8 such as solder layer in between, respectively. For example, if the IGBT chip is used as the power semiconductor chip 1, the copper sheet 10 is electrically connected with the collector electrode (not shown) of the chip 1 via the solder layer 7. A lead 26 extends from the copper sheet 10. Copper sheet 11 serving as rear surface metal layer disposed on the lower surface of the lower insulating substrate 9 is joined to a lower heat spreader 13 with a third joining material layer 12 such as solder layer in between.

Figure 2:
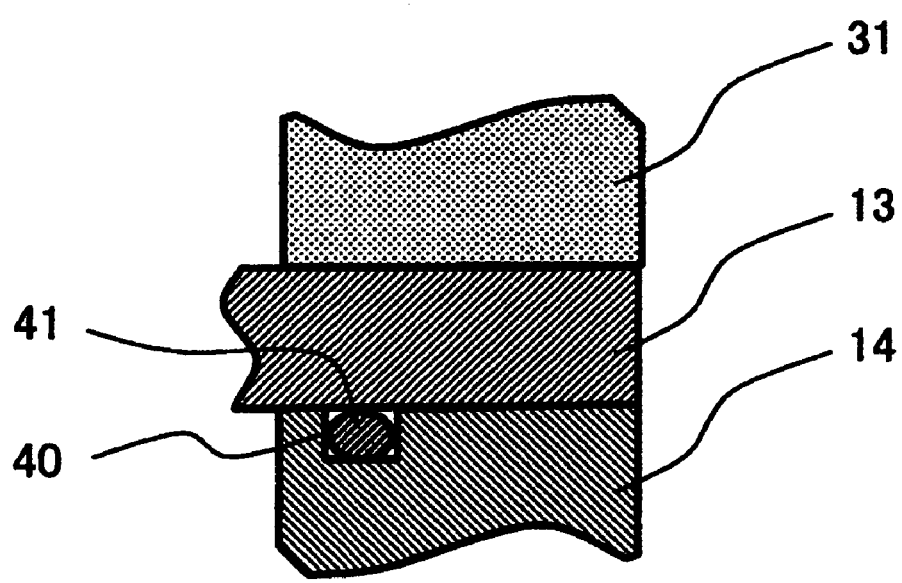
FIG. 2 schematically shows in vertical cross section how the heat spreader and the casing are sealed in the power semiconductor module according to the embodiment of this invention.

The lower heat spreader 13 is made of, for example, copper. The lower surface of the heat spreader 13 is provided directly with fins 130. The fins 130 may be attached to the spreader 13 by welding or brazing, or the fins 130 and the spreader 13 may be formed integrally. A casing 14 covers the lower surface of the heat spreader 13. The casing 14 and the heat spreader 13 form a chamber for refrigerant flow. Namely, the fins 130 are contained within the refrigerant chamber of the casing 14, and refrigerant such as antifreeze fluid flows through spaces among the fins 130. FIG. 2 is a magnified view of the point of contact between the heat spreader 13 and the casing 14, indicated by a dashed circle A in FIG. 1. As shown in FIG. 2, a groove 40 for an O-ring is cut in the casing 14, and an O-ring 41 hermetically seals the interfaces between the heat spreader 13 and the casing 14. The heat spreader 13 and the casing 14 are cramped together with a bolt 29 and a nut 30.

A terminal support 31 shown in FIG. 1 serves as a member to support and secure an electrode 26 and is made of insulating material. The terminal support 31 is fixed also to the heat spreader 13 and the casing 14 by means of bolts 29 and nuts 30. The terminal support 31 serves to prevent the lead 26 from coming in contact with the heat spreader 13.

An upper insulating substrate 18 is made of the same material as the lower insulating substrate 9. The lower surface of the upper insulating substrate 18 is joined directly to copper sheets 19, 20 serving as electrode metal layers. The upper surface of the upper insulating substrate 18 is joined directly to a copper sheet 21 serving as a rear electrode layer. The upper surfaces of the power semiconductor chips 1, 2 are joined to the copper sheets 19, 20 with fourth joining material layers 15, 16, 17 such as solder layer in between. For example, if the IGBT chip is used as the power semiconductor chip 1, the copper sheet 19 is electrically connected with the emitter electrode (not shown) of the chip 1 via the joining material layer 15 such as solder layer. A lead 27 extends outward from the copper sheet 19. The copper sheet 20 is electrically connected with the gate electrode (not shown) of the chip 1 via the joining material layer 16 such as solder layer, and a lead 28 extends outward from the copper sheet 20. A copper sheet 21 disposed on the upper surface of the upper insulating substrate 18 is joined to an upper heat spreader 23 with a fifth joining material layer 22 such as solder layer in between.

The upper heat spreader 23 is made of, for example, copper. The upper heat spreader 23 is provided with fins 230. A casing 24 covers the upper surface of the heat spreader 23, and a refrigerant chamber is formed between them. The fins 230 are contained within the refrigerant chamber of the casing 24, and refrigerant such as antifreeze fluid flows through spaces among the fins 230. The heat spreader 23 and the casing 24 are cramped together by means of the bolts 29 and nuts 30, and the interfaces between them is sealed with an O-ring 41.

The major and side surfaces of the power semiconductor chips 1, 2, the insulating substrates 9, 18, the copper sheets 10, 11, 19, 20, 21 joined to the insulating substrates and the leads 26, 27, 28 are entirely or partially covered with thin flexible layers of polyimide or polyamide-polyimide resin. After curing the flexible resin, the power semiconductor chips 1, 2, and the insulating substrates 9, 18 are enveloped with epoxy resin 25 to hermetically seal them. Such resin sealing may be formed by transfer mold process. The application of the thin flexible layers of polyimide or polyamide-polyimide resin can relax the stress developed in the chips or the solder layers due to the deformation of the hard epoxy resin. Also, the polyimide resin serves to maintain electric insulation between the electrodes. One or more of stuffs $SiO_2$, SiC, BN, $Si_3N_4$, AlN, and $Al_2O_3$ may be mixed as filler into the sealing resin 25 so as to reduce the thermal expansion of the resin 25.

In consideration of environmental protection, it is preferable to use lead-free material for all the joining material layers. For example, high temperature joining material of copper and tin particles mixed together is used for the first joining material layers 3, 4 for joining the chips 1, 2 with the spacers 5, 6, the second joining material layers 7, 8 for joining the spacers 5, 6 with the copper sheet 10, and the fourth joining material layers 15, 16, 17 for joining the chips 1, 2 with the copper sheets 19, 20. In the stacking assembly, the paste of the above mentioned high temperature joining material is applied between the chips 1, 2 and the spacers 5, 6, between the spacers 5, 6 and the lower insulating substrate 9, and between the chips 1, 2 and the upper insulating substrate 18. The paste layers are simultaneously or individually heated to be fused for joining. Joining material, e.g. lead-free solder of Sn-3Ag-0.5Cu system alloy, having a lower melting point than that of the joining material used for the first, second or fourth joining material layers is used for the third joining material layer 12 for joining the lower insulating substrate 9 with the lower heat spreader 13 and for the fifth joining material layer 22 for joining the upper insulating substrate 18 and the upper heat spreader 23. The joining material layer 12 and the joining material layer 22 are simultaneously or individually heated to be fused for joining. At this time, it may be preferable to also fuse or melt the tin which is a higher temperature side joining material and use a vacuum furnace for void-less structure, namely, use a furnace which includes a vacuum forming process.

A variety of brazing and soldering methods can be used to join the metal members of the power semiconductor module according to this invention. Examples include soldering using solders having a relatively low melting temperature as joining material and brazing using braze alloys having a relatively high melting temperature as a joining material.

Dimples may be formed in the surfaces of the heat spreaders 13, 23 to prevent the resin disposed thereon from peeling off. To preserve this effect, polyimide should not be applied on the surfaces of the heat spreaders so as not to fill the dimples with polyimide.

Figure 3A:
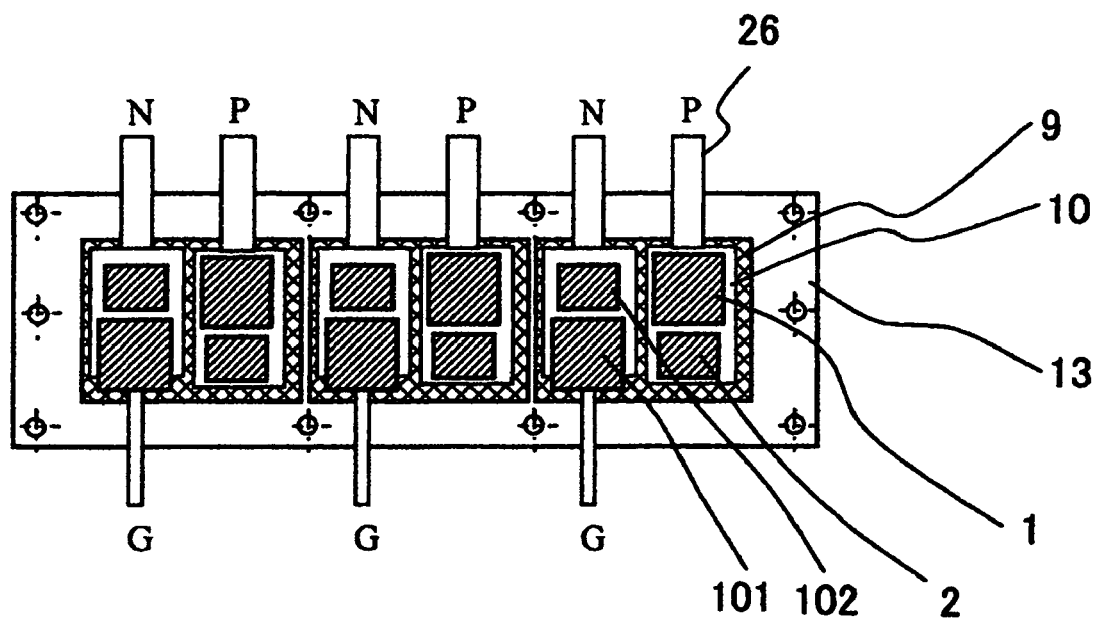
FIGS. 3A and 3B schematically show in horizontal cross section the two aspects of the power semiconductor module as the first embodiment of this invention.
Figure 3B:
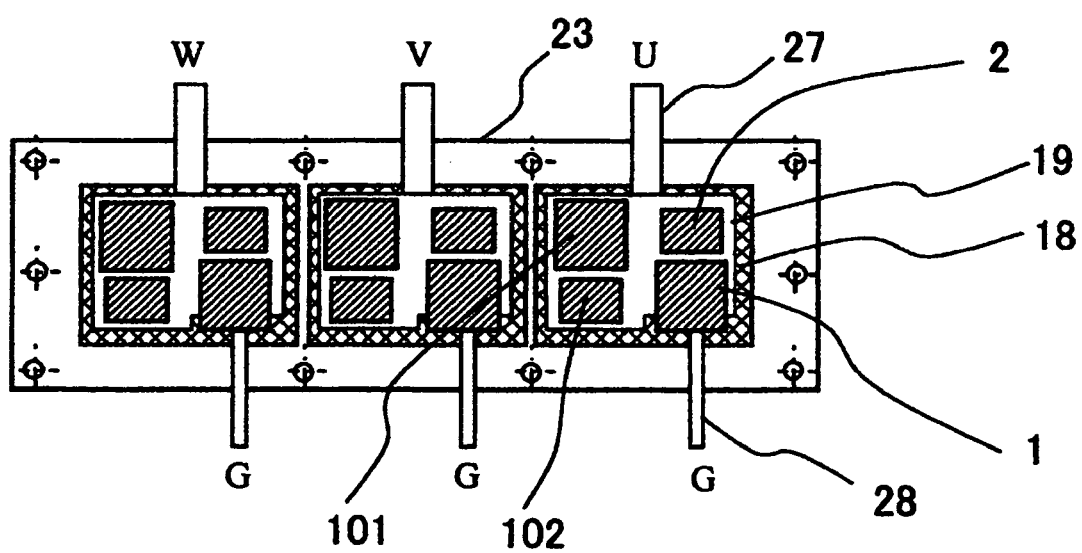

The planar layout of the constituents such as the power semiconductor chips used in the power semiconductor module according to this invention will now be described with reference to FIGS. 3A and 3B. The power semiconductor module shown in FIGS. 3A and 3B incorporates therein six IGBTs and is used to form a bridge circuit connected with the output stage of an inverter for generating three-phase alternating currents. The power semiconductor module has leads P connected with, for example, a positive voltage source; leads N connected with, for example, the ground potential or a negative voltage source, leads G serving as the input terminals for the gate control signals of the IGBTs, and leads U, V and W serving as the output terminals for the phases U, V and W of the three-phase alternating currents. FIGS. 3A and 3B schematically show the horizontal cross sections of the chips 1, 2, as viewed from top and bottom, respectively. FIG. 3A shows the layout of the lower heat spreader 13, the lower insulating substrate 9, and the power semiconductor chips 1, 2 while FIG. 3B shows the layout of the upper heat spreader 23, the upper insulating substrate 18, and the power semiconductor chips 1, 2.

The rightmost power semiconductor chips 1 in FIGS. 3A and 3B is, for example, an IGBT chip, wherein current flows from the lower copper sheet 10 connected with the lead P in FIG. 3A to the upper copper sheet 19 connected with the lead U. Namely, according to this layout, the collector electrode is on the lower side, and the emitter electrode is on the upper side. The gate electrode of the chip 1 is located on that one of the two principal surfaces of the semiconductor substrate which is on the same side as the emitter electrode, that is, on the upper side. Namely, the lead G is connected with the upper principal surface. The power semiconductor chip 2 is a freewheel diode which is connected in parallel with the IGBT chip 1 and whose anode and cathode are connected with the upper copper sheet 19 coupled to the lead U and the lower copper sheet 10 coupled to the lead P, respectively.

On the other hand, the power semiconductor chip 101, second from the rightmost one in FIGS. 3A and 3B, is an IGBT chip which is connected in series with the IGBT chip 1 and which along with the IGBT chip 1 constitutes the U-phase arm circuit and is arranged such that, in the chip 101, current flows from the upper copper sheet 19 connected with the lead U which is common for the emitter of the chip 1 to the lower copper sheet 10 connected with the lead N. Namely, in this layout, the collector electrode is on the upper side and the emitter electrode is on the lower side. The gate electrode of the chip 101 is formed on the lower principal surface where the emitter electrode is also formed. Thus, the lead G for the gate electrode is formed on the lower principal surface of the chip. The diode 102 connected in parallel with the IGBT chip 101 has its anode connected with the upper copper sheet 19 coupled to the lead U and its cathode connected with the lower copper sheet 10 coupled to the lead N.

The chips and the electrodes constituting the U-phase arm circuit are described above, and similar structures are true for the V- and W-phase arm circuits. A motor circuit, for example, is connected with the leads U, V and W from which three-phase alternating currents are delivered. The spacer 5 shown in FIG. 1 should preferably be provided on the side where the collector is formed, in the IGBT chip as described above wherein fewer electrodes are formed on the collector side.

With this planar layout, multitudes of chips can be packed in a small area so that the size of the power module can be reduced.

Figure 4:
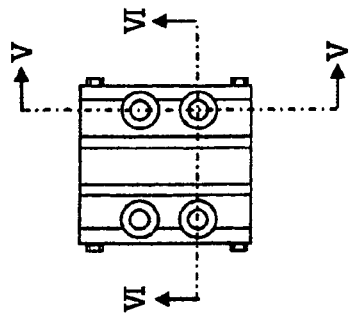
FIG. 4 schematically shows in lateral view an example of the structure of the refrigerant channels used for the power semiconductor module as the first embodiment of this invention.
Figure 5:
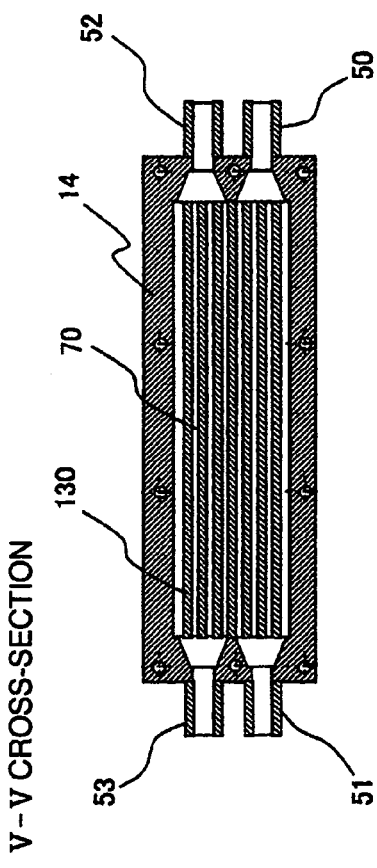
FIG. 5 is a cross-sectional view of the refrigerant channels, taken along line V-V in FIG. 4.
Figure 6:
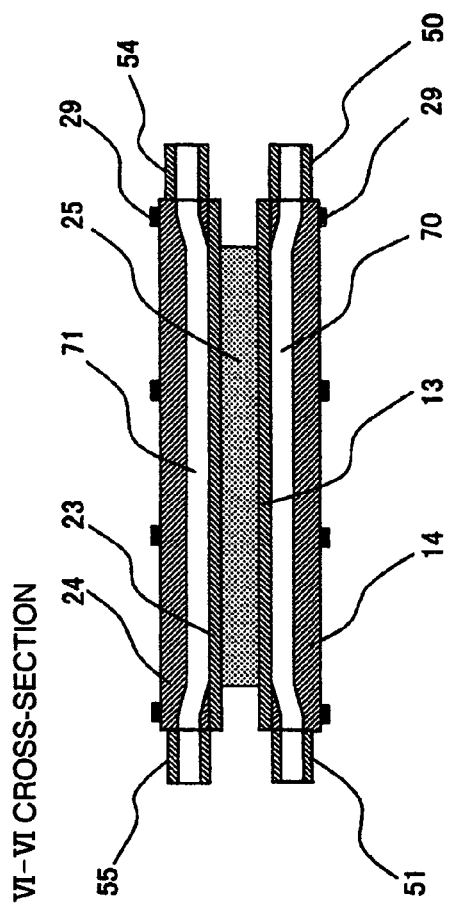
FIG. 6 is a cross-sectional view of the refrigerant channels, taken along line VI-VI in FIG. 4.

FIGS. 4 through 8 show the structures of refrigerant flow channels for fluid refrigerant such as antifreeze fluid. FIGS. 4 through 6 schematically show the refrigerant flow channel structure for a power semiconductor module. FIG. 5 is the cross sectional view of the lower refrigerant flow channels 70, taken along line V-V in FIG. 4 showing a side view. FIG. 6 is the cross sectional view taken along line VI-VI in FIG. 4 showing a side view. As shown in the V-V cross section in FIG. 5, the casing 14 is in tight contact with both the ends of the central fin 130, which serves as a partition wall that divides the space within the casing 14 into two compartments serving as two refrigerant chambers. In each refrigerant chamber, refrigerant flows through refrigerant flow channels 70 defined between the fins 130. The upper refrigerant flow channels 71 taken along line B-B cross section have the same structure as the lower refrigerant channels 70 taken along line A-A cross section. Pipes 50-57 serve as refrigerant inlets and outlets of the two refrigerant chambers of the lower casing 14 and the two refrigerant chambers of the upper casing 24, respectively. They also serve as connecting portions for external piping which may communicate with a refrigerant circulating system including a pump.

Figure 7:
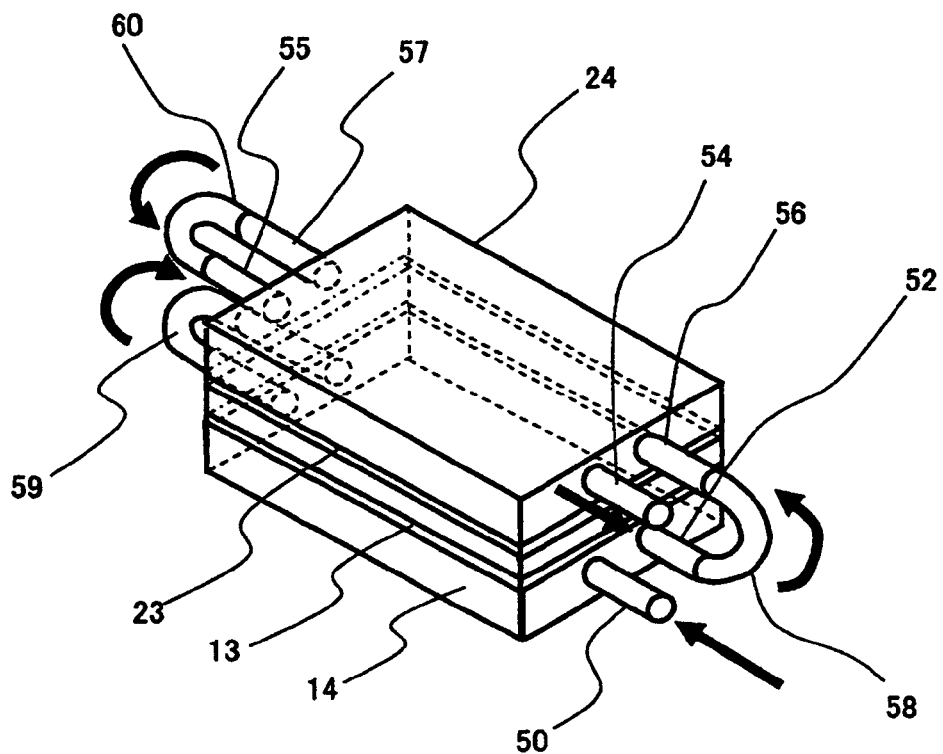
FIG. 7 shows an example of the structure of external piping connected with the four refrigerant chambers formed in the lower and upper casings of the power semiconductor module as the first embodiment of this invention, and the directions of flow of refrigerant.
Figure 8:
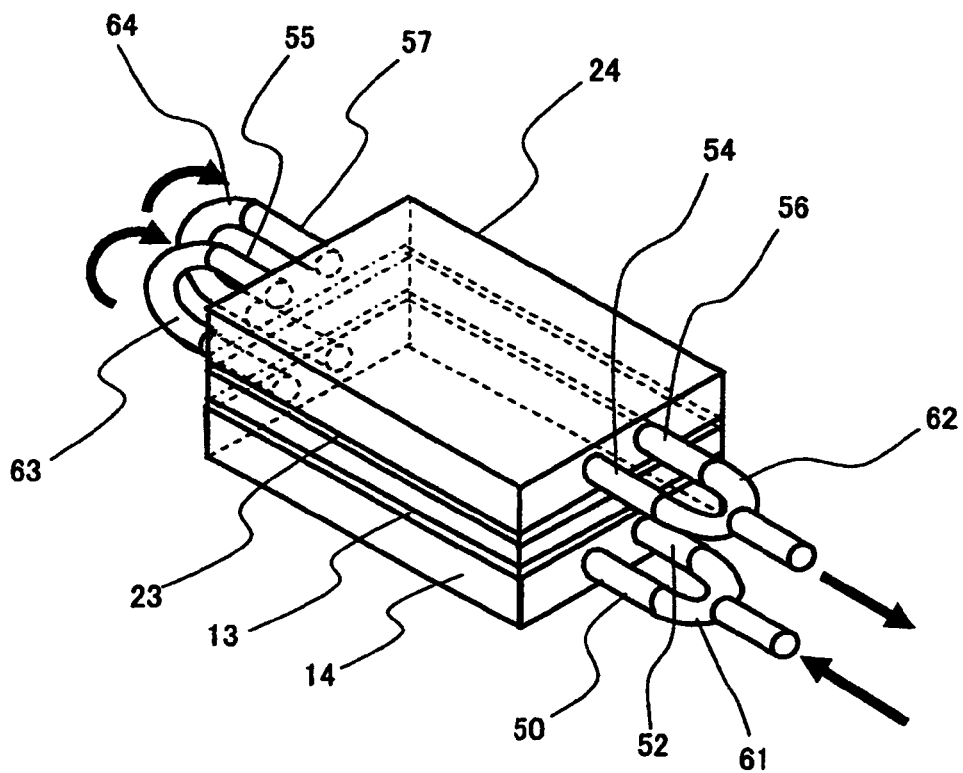
FIG. 8 shows another example of the structure of external piping connected with the four refrigerant chambers formed in the lower and upper casings of the power semiconductor module as the first embodiment of this invention, and the directions of flow of refrigerant.

FIGS. 7 and 8 schematically show the structures of external piping coupled to the four refrigerant chambers of the lower and upper casings, and examples of the associated refrigerant flow paths. Arrows in FIG. 7 indicate the directions of flow of refrigerant. In FIG. 7, refrigerant supplied through the port 50 into one of the lower refrigerant chambers flows through return piping 59 constituting an outer connection piping connecting between the ports 51 and 53 into the other of the lower refrigerant chambers. Then, the refrigerant flows through return piping 58 connecting between the ports 52 and 56 into one of the upper refrigerant chambers. Further, the refrigerant flows through return piping 60 connecting between the ports 57 and 55 into the other of the upper refrigerant chambers. The refrigerant is finally discharged from the upper refrigerant chamber at the port 54. Namely, in this structure, the four refrigerant chambers are connected in series with one another via external piping.

FIG. 8 shows another example of refrigerant flow paths with different external piping structure. Arrows in FIG. 8, similar to those shown in FIG. 7, indicate the directions of refrigerant flow. In this structure, the ports 50 and 52 of the lower refrigerant chambers are provided with a bifurcating piping 61 and the ports 50 and 52 serve as refrigerant inlets. On the other hand, the ports 54 and 56 of the upper refrigerant chambers are provided with converging piping 62 so that these ports 54 and 56 serve as refrigerant outlets. Refrigerant branched out by the bifurcating piping 61 flows parallel through the two lower refrigerant chambers. Then, the refrigerant flows through return piping 63 connecting between the ports 51 and 55 and through return piping 64 connecting between the ports 53 and 57, into the upper refrigerant chambers, and further flows parallel through the upper refrigerant chambers. The refrigerant flowing through the upper refrigerant chambers is discharged from the ports 54 and 56, converges through the converging piping 62, and finally leaves the refrigerant chambers. Thus, in this structure, two refrigerant chambers are connected in series with each other to form a resultant serial refrigerant chamber and two of such resultant serial refrigerant chambers are connected in parallel with each other.

Alternatively, it is possible to cause refrigerant to flow parallel through the four refrigerant chambers and also to provide more than two lower refrigerant chambers and more than two upper refrigerant chambers.

As described above, the structures where the refrigerant chambers are provided with the ports 50-57 for external connections as shown in FIGS. 4 through 6, enable the refrigerant chambers to be arbitrarily coupled to one another by controlling the layout of the external piping coupled to the ports, to change the refrigerant flow through the chambers. These structures therefore can make it possible to provide refrigerant flows suitable for attaining a required refrigerating performance or for the refrigerant circulating system to be connected with the module according to this invention. For example, if all the refrigerant chambers are coupled in series, the total length of refrigerant path becomes large so that the heat absorption by the refrigerant during its effective contact with the module can be increased. On the other hand, if all the refrigerant chambers are connected in parallel, pressure loss can be reduced. Further, even in the case where the heat generation of a power semiconductor chip is not uniform within a plane, efficient refrigeration is possible by making the amount of refrigerant flowing through the refrigerant chamber located near the area of higher heat generation, larger than the amount of refrigerant flowing through the refrigerant chamber located near the area of lower heat generation.

Figure 9:
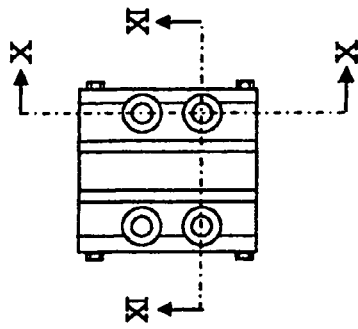
FIG. 9 schematically shows in lateral view another example of the structure of the refrigerant channels used for the power semiconductor module as the first embodiment of this invention.
Figure 10:
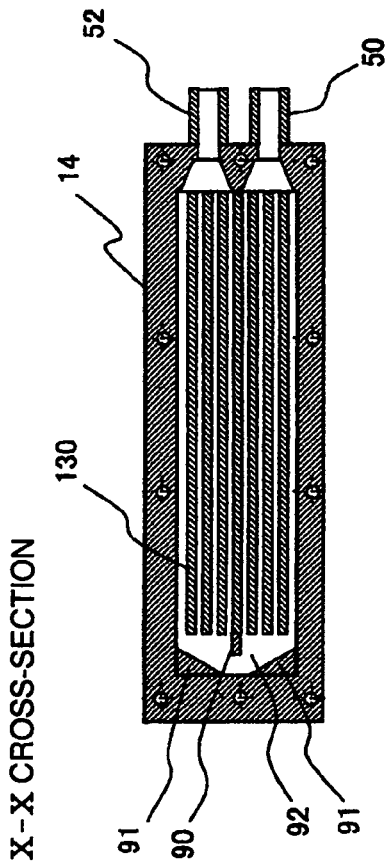
FIG. 10 is a cross section of the refrigerant channels taken along line X-X in FIG. 9 as lateral view.
Figure 11:
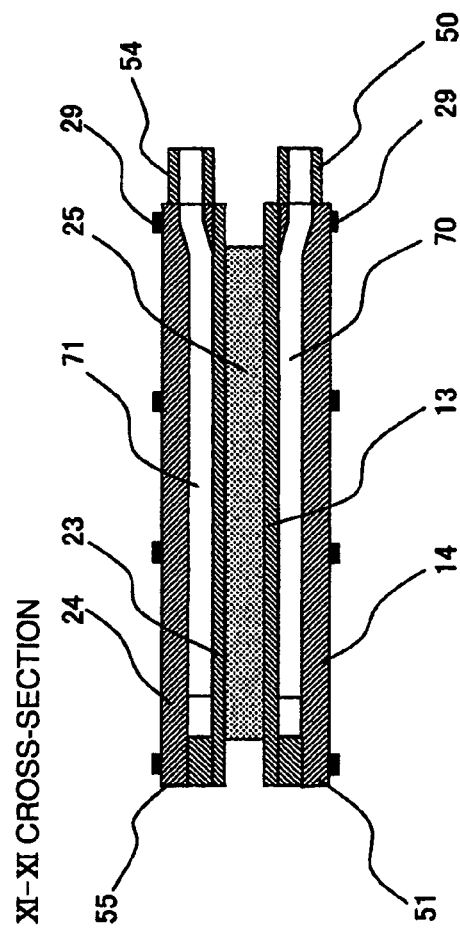
FIG. 11 a cross section of the refrigerant channels taken along line XI-XI in FIG. 9 as lateral view.

FIGS. 9 through 11 show another structure of refrigerant channels for the power semiconductor module according to this invention. FIG. 10 is the cross sectional view of the lower refrigerant channels 70, taken along line X-X in FIG. 9 showing a lateral view. FIG. 11 is the cross sectional view taken along line XI-XI in FIG. 4 as a lateral view. As shown in FIG. 10, the casing 14 is in contact with the central fin 130 at one end thereof in the lengthwise direction of the central fin 130, and ports 50 and 52 are provided at the same end of the casing 14. In this structure, the central fin 130 divides the space in the casing 14 into two refrigerant chambers: one housing refrigerant inward channels and the other housing refrigerant outward channels. At the other end of the casing 14 are internally provided guide members 90 and 91. The guide member 90 is connected with the central fin 130 to make the central fin 130 substantially longer than the other fins 130. There is a gap between the guide member 90 and the internal wall of the casing 14, through which the refrigerant chamber housing the inward channels communicates with the refrigerant chamber housing the outward channels, to form a refrigerant return path 92 from the inward to the outward channels. The guide members 91 are provided at the corners of the internal wall of the casing 14. The shape and the location of each of the members 91 are devised in such a manner that refrigerant can move smoothly from the inward channels to the outward channels. For example, let the ports 50 and 52 serve as refrigerant inlet and outlet, respectively. Then, the lower half space in the casing 14, i.e. lower refrigerant chamber, provides inward channels while the upper half space in the casing 14, i.e. upper refrigerant chamber, provides outward channels. As shown in FIG. 10, the refrigerant flowing among the fins 130 forming the inward channels in the leftward direction is prevented from bending sharply into the outward channels by the existence of the guide member 90, and the channel streams of the refrigerant converge at the left end of the fins 130, keeping their original flow directions. The surface of the guide member 91 provided at the lower left corner smoothly changes the direction of the converged refrigerant flow from leftward to upward, that is, guides the flow into the refrigerant return path 92 leading to the outward channels. The refrigerant flowing from the return path 92 of the inward channels to the return path 92 of the outward channels has its direction of flow changed smoothly from upward to rightward by the surface of the guide member 91 provided at the upper left corner, reaching the area above the guide member 90. Then, the refrigerant flows into the outward channels among the fins 130. Thus, vortices can be prevented from generating in the refrigerant return path 92 by the existence of the guide members 90 and 91 so that the refrigerant can be smoothly moved from the inward channels to the outward channels. Consequently, pressure loss can be reduced, and refrigerating efficiency can be improved.

In this structure, the refrigerant return path 92 is formed in the casing 14, and two refrigerant chambers are in the form of fold-back channels. With this structure, external connecting parts can be dispensed with. The foregoing description has been dedicated to the lower casing 14, but the same description will be true for the upper casing 24.

The power semiconductor chip can be fabricated by using a semiconductor substrate made mainly of silicon Si. If, however, it is fabricated by using a semiconductor substrate made of wide-energy-gap semiconductor such as silicon carbide SiC or gallium nitride GaN, operations at higher temperatures are possible so that the size of a chip or a module can be further reduced. Further, a temperature sensor may be provided, for example, on the substrate to prevent the thermal runaway due to the rise of operating temperature.

It is noted here that in the foregoing description the terms "upper" and "lower" are used for convenience' sake, but that the power semiconductor module according to this invention can, of course, be mounted in the lateral or any other orientation. If it is mounted, for example, in the lateral orientation, the terms "upper" and "lower" will be replaced by "right" and "left".

According to this embodiment described hitherto, heat spreaders are provided on the upper and lower side of the power module; the insulating substrates are joined to the heat spreaders with brazing including soldering; and the fins attached directly to the heat spreaders are cooled with refrigerant. Accordingly, refrigeration suitable for chips having high density heat generation density becomes possible, and therefore the size of a power semiconductor chip or the overall size of a power semiconductor module can be reduced.

Embodiment 2

Figure 12:
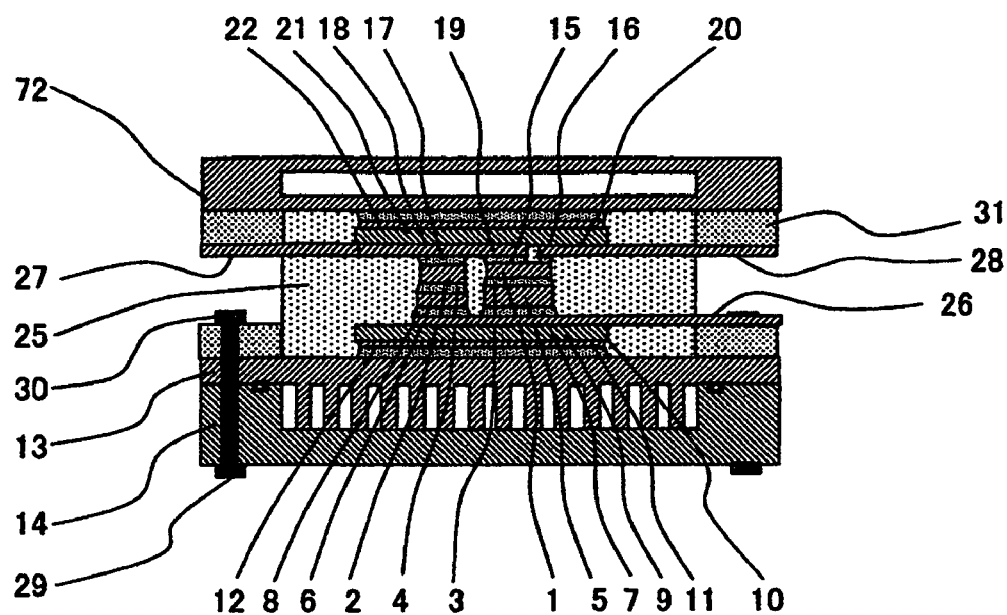
FIG. 12 schematically shows in vertical cross section a power semiconductor module as a second embodiment of this invention.
Figure 13:
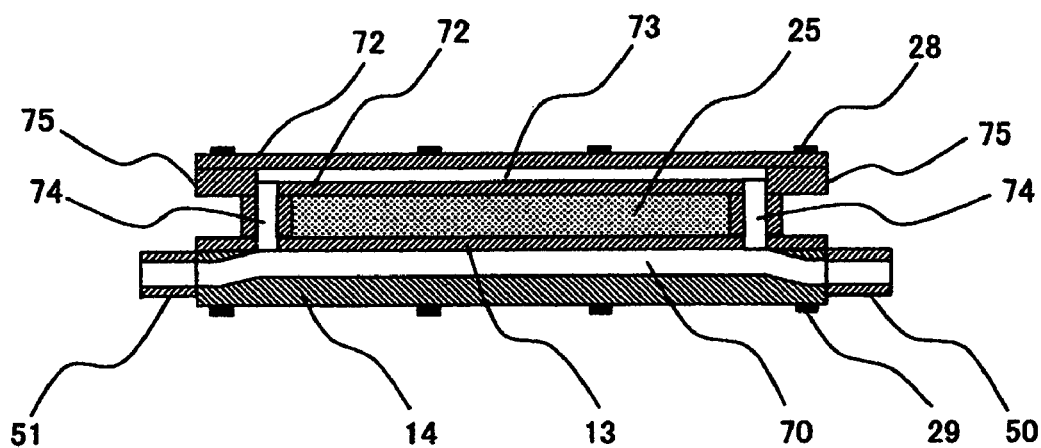
FIG. 13 schematically shows in vertical cross section the structure of refrigerant channels used for the power semiconductor module as the second embodiment of this invention.

FIG. 12 schematically shows in cross section a power semiconductor module as a second embodiment of this invention, the cross section being a vertical cross section perpendicular to the direction of flow of the refrigerant through the refrigerant flow channels. FIG. 13 schematically shows the cross sectional structure of the refrigerant flow channels according to this second embodiment, the cross section being parallel with the direction of flow of the refrigerant.

A heat sink joined to the lower surface of the lower insulating substrate 9 is similar in structure to that used in the first embodiment described above, wherein the heat spreader 13 with fins 130 erected thereon is covered by the casing 14, and refrigerant flows through the lower flow channels 70 formed in the space enclosed by the heat spreader 13 and the casing 14.

On the other hand, a heat sink joined to the upper surface of the upper insulating substrate 18 is a thin heat spreader 72 having a single refrigerant flow channel, instead of the upper heat spreader 23 with fins as used in the first embodiment described above. A space through which refrigerant can flow is previously formed within the thin heat spreader 72, and the space serves as an upper refrigerant flow channel 73.

The upstream and downstream ends of the upper channel 73 are provided with connecting ducts 74 communicating with lower channels 70. The connecting ducts 74 are formed with connecting members 75 to communicate the end openings of the thin heat spreader 72 with the openings provided in the lower heat spreader 13. The remaining parts are the same as those of the first embodiment, and the description thereof is omitted.

Refrigerant is supplied into the refrigerant flow channels via refrigerant ports provided at one end of the lower casing 14 and discharged from the channels via ports provided at the opposite end of the lower casing 14. For example, refrigerant is supplied into the lower channels 70 via the port 50 and discharged from the lower channels 70 via the port 51. A part of the refrigerant supplied into the lower channels 70 flows through the channels 70 toward the port 51, and the remaining part of the refrigerant is guided into the upper refrigerant channels 73 through the connecting ducts 74 at the upstream end of the upper channel. The refrigerant flowing into the upper channel 73 further flows downstream through the upper channel 73 and is guided into the port 51 via the connecting duct 74 at the downstream end.

Figure 14:
FIG. 14 schematically shows in vertical cross section a heat sink having micro channel structure, used for the power semiconductor module as the second embodiment of this invention.

An alternative structure for the upper heat sink may be as shown in FIG. 14, wherein multitudes of fine refrigerant channels 81 are cut in a heat sink 80 to form a so-called micro channel structure. FIG. 14 shows the vertical cross section perpendicular to the direction of the flow of refrigerant. If this structure is employed, an insulating substrate and a heat spreader are provided on the lower side of a power module, and an insulating substrate and a heat sink are provided on the upper side of the power module. The heat spreader and the heat sink are joined to the insulating substrates by using brazing including soldering. Thus, heat generated by the power semiconductor module can be radiated with high thermal conductivity from the upper and lower surfaces of the module. Therefore, power semiconductor chips can be cooled with high efficiency, high density heat generation can be well coped with, and accordingly the size of a power semiconductor chip or the overall size of a power semiconductor module can be reduced.

Embodiment 3

Figure 15:
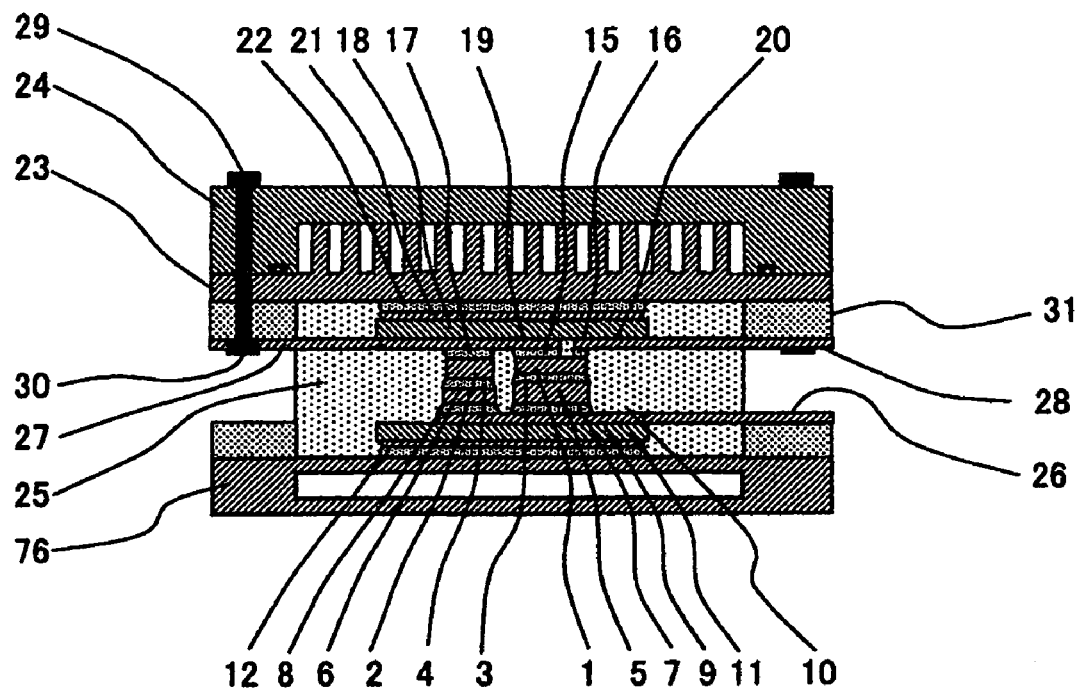
FIG. 15 schematically shows in vertical cross section a power semiconductor module as a third embodiment of this invention.
Figure 16:
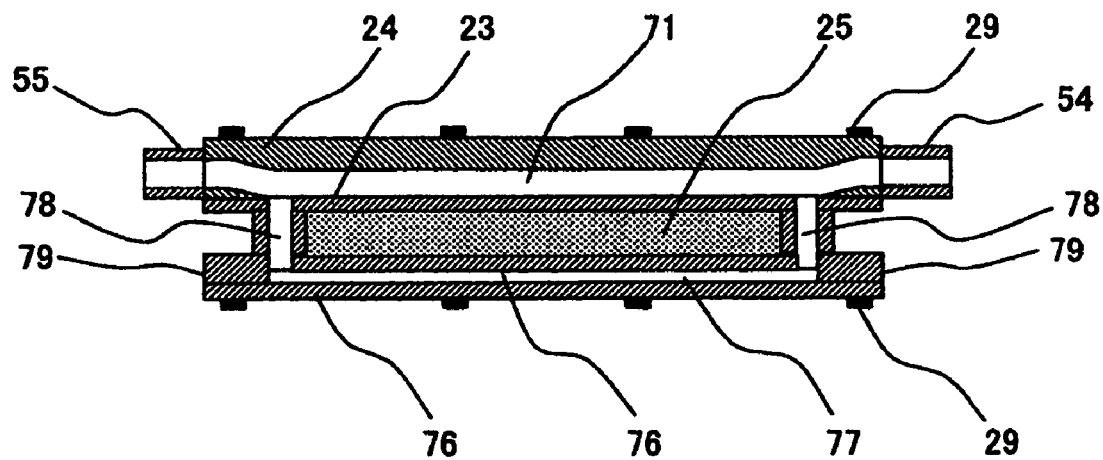
FIG. 16 schematically shows in vertical cross section the structure of refrigerant channels used for the power semiconductor module as a third embodiment of this invention.

FIG. 15 schematically shows in cross section a power semiconductor module as a third embodiment of this invention, the cross section being a vertical cross section perpendicular to the direction of flow of the refrigerant through the refrigerant channels. FIG. 16 schematically shows the cross sectional structure of the refrigerant channels according to this third embodiment, the cross section being parallel with the direction of flow of the refrigerant.

In this embodiment, contrary to the above described second embodiment, a thin heat spreader 76 is used as a lower refrigerant flow channel 77. The thin heat spreader 76 having a single refrigerant flow channel is used as a heat sink, instead of the lower heat spreader 13 with fins as used in the first embodiment described above. The upstream and downstream ends of the lower channel 77 are provided with connecting ducts 78 communicating with the upper channels 71. The connecting ducts 78 are formed with connecting members 79 to communicate the end openings of the thin heat spreader 76 with the openings provided in the lower heat spreader 13. The remaining parts are the same as those of the first embodiment, and the description thereof is omitted.

For example, refrigerant is supplied into the upper channels 71 via the port 54 provided at one end of the upper casing 24 and discharged from the upper channels 71 via the port 55 on the opposite end. A part of the refrigerant supplied into the upper channels 71 flows through the channels 71 toward the port 55, and the remaining part of the refrigerant is guided into the lower refrigerant channel 77 via the connecting ducts 78 at the upstream end of the upper channels 71. The refrigerant flowing into the lower channel 77 further flows downstream through the lower channel 77 and is guided into the port 55 via the connecting ducts 78 at the downstream end.

An alternative structure for the lower channel may be as shown in FIG. 14, wherein multitudes of fine refrigerant channels are cut in a heat sink to form a so-called micro channel structure.

If this structure is employed, an insulating substrate and a heat spreader are provided on the upper side of a power module, and an insulating substrate and a heat sink are provided on the lower side of the power module. The heat spreader and the heat sink are joined to the insulating substrates by using braze welding including soldering. Thus, heat generated by the power semiconductor module can be radiated with high thermal conductivity from the upper and lower surfaces of the module. Therefore, power semiconductor chips can be cooled with high efficiency, high density heat generation can be well coped with, and accordingly the size of a power semiconductor chip or the overall size of a power semiconductor module can be reduced.

Embodiment 4

Figure 17:
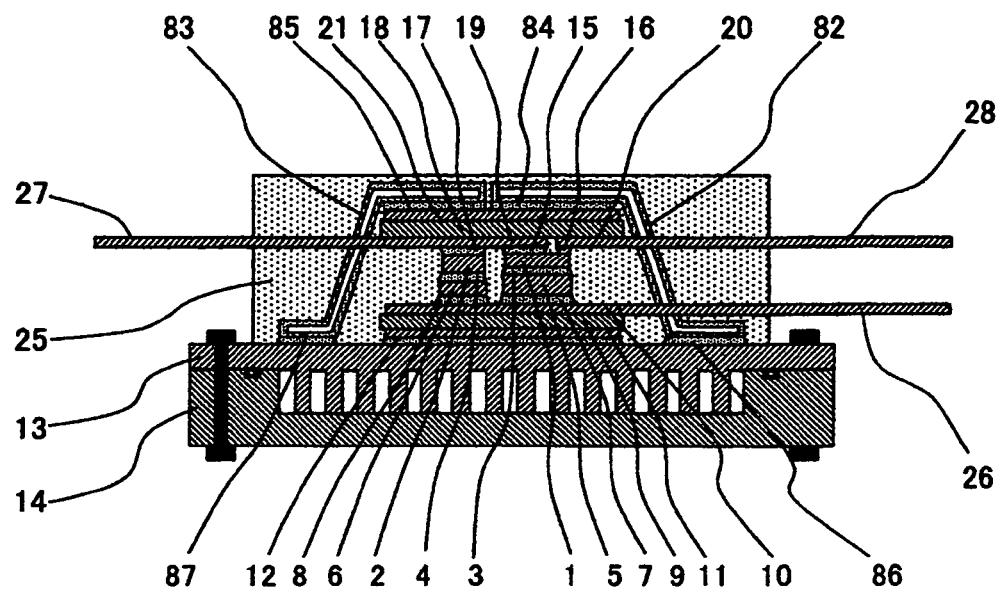
FIG. 17 schematically shows in vertical cross section a power semiconductor module as a fourth embodiment of this invention.

FIG. 17 schematically shows in vertical cross section a power semiconductor module as a fourth embodiment of this invention. In this embodiment, heat transferred to the upper insulating substrate 18 is radiated by using heat pipes 82, 83. One end of the heat pipe 82 and one end of the heat pipe 83 are joined to the upper surface of the copper sheet 21 attached to the upper insulating substrate 18, by using joining material 84, 85 such as solder. The other ends of the heat pipes 82, 83 are joined to the lower heat spreader 13 by using joining material 86, 87 such as solder.

In this embodiment, heat transferred to the upper surface of the chips is transferred via the upper insulating substrate 18 to the heat pipes 82, 83, and further transferred via the heat pipes 82, 83 to the lower heat spreader 13.

In this embodiment, the heat pipes 82, 83, with their one ends joined to the upper insulating substrate 18, extend from the upper surface of the upper insulating substrate 18 outward in the direction in which the leads 26, 27, 28 extend from the insulating substrates 9, 18. The leads 26, 27, 28 extend perpendicularly to the lengthwise direction of the module, for example, as shown in FIGS. 3A and 3B. The heat pipes 82, 83 are laid out between these leads 26, 27, 28 and connect the upper insulating substrate 18 and the lower heat spreader 13.

The heat pipes 82, 83 may be in the form of a thin plane-type heat pipe having a large lateral dimension. Such a plane-type heat pipe can secure large contact areas with the upper insulating substrate 18 and the lower heat spreader 13 so that refrigerating efficiency can be improved.

The heat pipes 82, 83 are joined to the upper insulating substrate 18 by using, for example, soldering as described above, and the lower heat spreader 13 is also joined to the lower insulating substrate 9 by using joining material such as solder as in the first embodiment described above.

In the structure of this embodiment, too, the upper and lower insulating substrates 18 and 9 are joined with high heat conductivity to the heat pipes and heat spreader by using brazing including soldering, so that heat generated in the power semiconductor chip can be radiated from the upper and lower surfaces thereof. Therefore, power semiconductor chips can be cooled with high efficiency, high density heat generation can be well coped with, and accordingly the size of a power semiconductor chip or the overall size of a power semiconductor module can be reduced.

Embodiment 5

Figure 18:
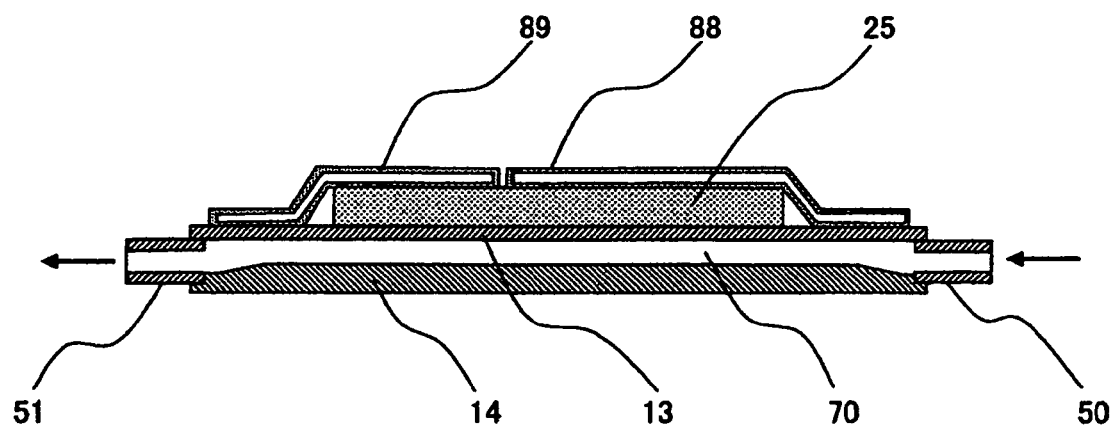
FIG. 18 schematically shows in vertical cross section a power semiconductor module as a fifth embodiment of this invention.

FIG. 18 schematically shows in vertical cross section a power semiconductor module as a fifth embodiment of this invention, the cross section being a vertical cross section parallel with the lower channels 71 along the fins 130 of the lower heat spreader 13. Also in this embodiment are used heat pipes 88, 89 with their one ends joined to the upper insulating substrate 18 with solder, to cool the upper surface of the chip as in the fourth embodiment described above. In this embodiment, the heat pipes 88, 89 extend from the upper insulating substrate 18 outward in the direction perpendicular to the leads 26, 27, 28. For example, as shown in FIGS. 3A and 3B, the heat pipes 88, 89 are laid out in the lengthwise direction of the power module. The extended ends of the heat pipes 88, 89 are joined to the lower heat spreader 13, just as in the case of the heat pipes 82, 83 of the fourth embodiment described above.

The lower channels 70 also run in this lengthwise direction. Accordingly, the heat pipes are laid out basically in parallel with the lower channels 71 as shown in FIG. 18. The ports 50, 51 provided at the lower casing 14 are also aligned in the direction perpendicular to the leads 26, 27, 28.

With the structure, the positional interference between the heat pipes and the leads can be eliminated, whereby the overall structure is simplified. For example, even if the interval between leads is small, the layout of the heat pipes is easy since heat pipes need not be disposed between the leads. It is also possible to increase the width of a heat pipe to enhance cooling efficiency.

Further, the alignment of the ports 50, 51 is such that they do not interfere with leads 26, 27, 28, and therefore the overall structure can be simplified, and wiring and piping layout can also be simplified.

The structure of this embodiment also enables power semiconductor chips to be cooled with high efficiency as with the fourth embodiment described above, so that high density heat generation can be well coped with, and accordingly the size of a power semiconductor chip or the overall size of a power semiconductor module can be reduced.

Embodiment 6

Figure 19:
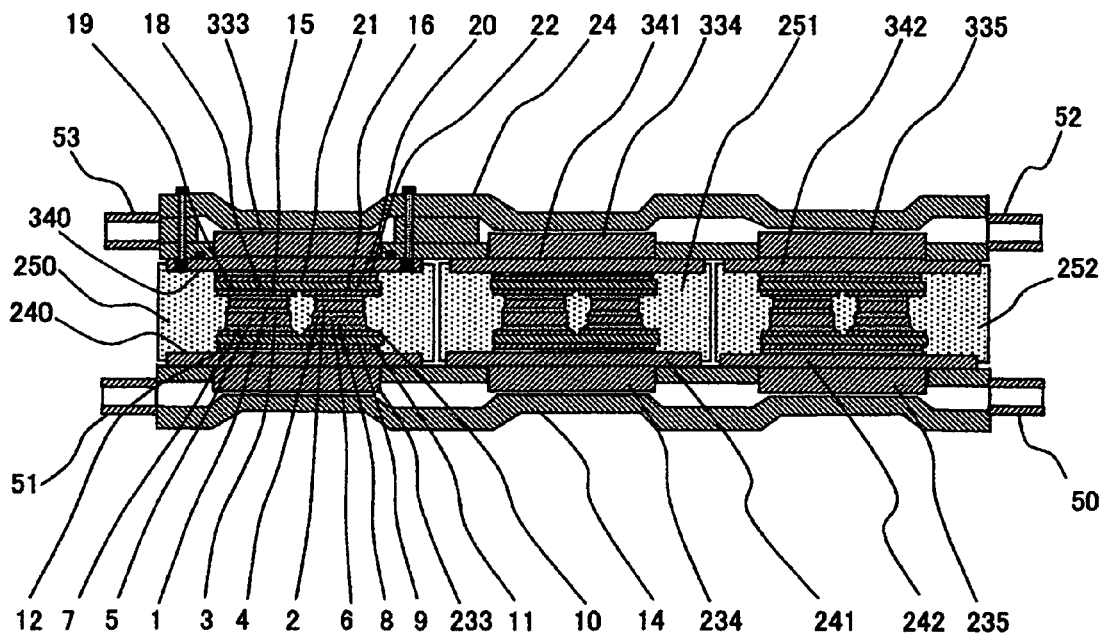
FIG. 19 schematically shows in vertical cross section a power semiconductor module as a sixth embodiment of this invention.
Figure 20A:
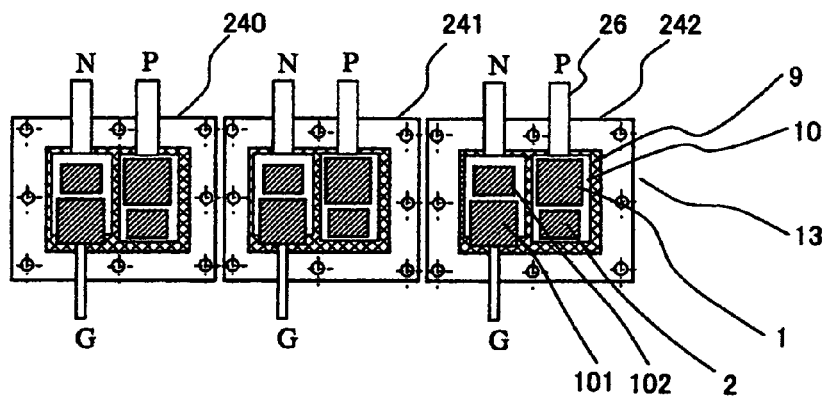
FIGS. 20A and 20B are horizontal cross sections of the power semiconductor module as the sixth embodiment of this invention.
Figure 20B:
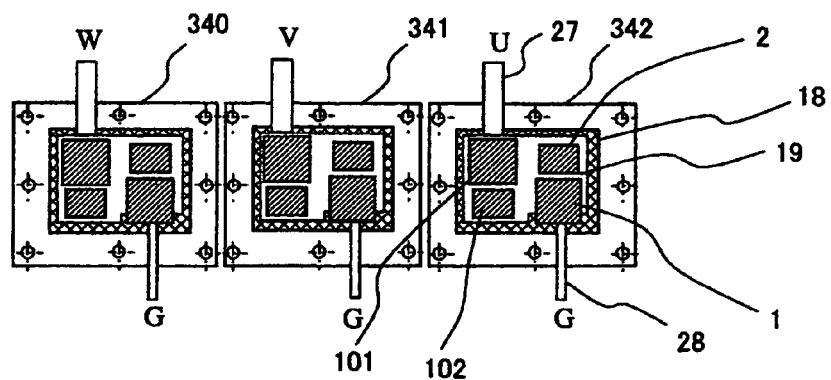

FIG. 19 schematically shows in vertical cross section a power semiconductor module as a sixth embodiment of this invention. FIG. 19 is a cross section taken along line XXIII-XXIII in FIG. 22. FIGS. 20A and 20B are planar layouts of the constituents of power semiconductor chips of a power semiconductor module according to this embodiment. FIGS. 20A and 20B schematically show the horizontal layout of the constituents of the power semiconductor module of this embodiment such as power semiconductor chips, FIGS. 20A and 20B showing the horizontal cross sections of the chips 1, 2 as viewed from top and bottom, respectively. This power semiconductor module is used, for example, to serve as a bridge circuit at the output stage of an inverter for generating three-phase alternating currents. The module, similar to the module shown in FIGS. 3A and 3B, has its own power semiconductor circuits for the phases U, V and W of three-phase alternating currents.

One feature of this embodiment is that sealing resin is divided into plural blocks (constituent resin blocks). For example, the sealing resin is divided into three resin blocks 250, 251, 252 corresponding to the U, V and W phase arms of the power semiconductor circuit. Epoxy resin may be used as such sealing resin.

Additionally, according to the division of the sealing resin, each of the lower and upper heat spreaders is divided into three sections (constituent heat spreaders) corresponding to the U, V and W phase arms of the power semiconductor circuit. FIG. 20A shows the split lower heat spreaders 240, 241, 242, and FIG. 20B shows the split upper heat spreaders 340, 341, 342. It is noted here that the positions at which and the patterns into which, the sealing resin is divided are not limited to those described above, but may be substituted for other positions and patterns.

Figure 21:
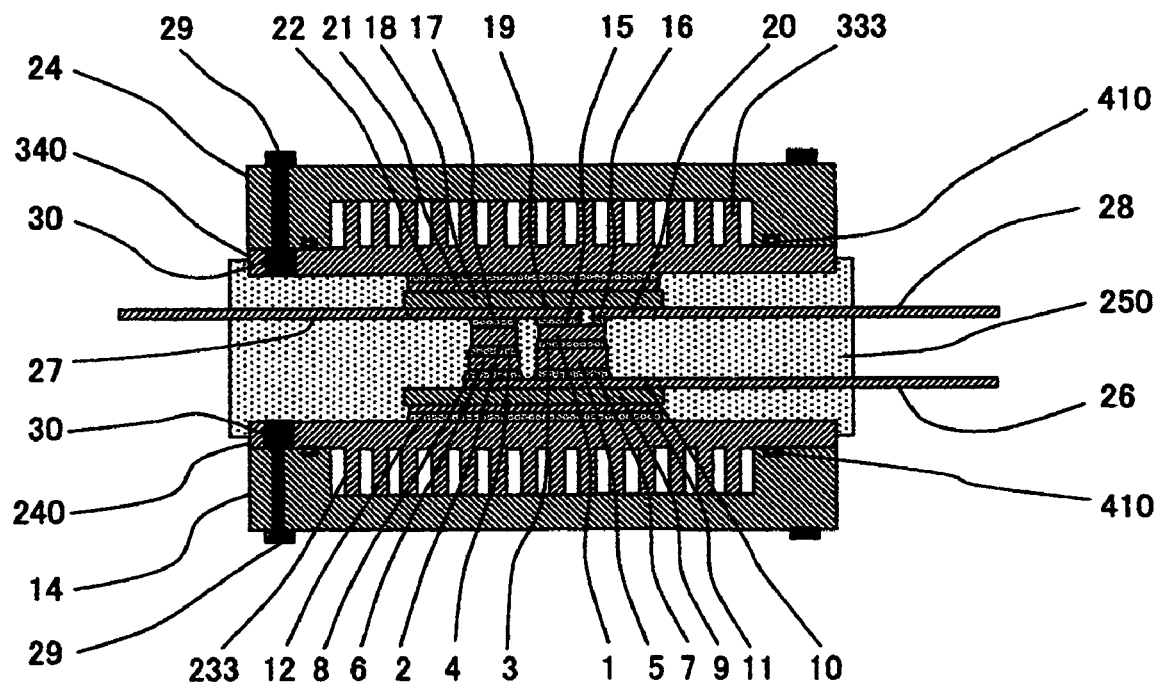
FIG. 21 is a cross sectional view of the power semiconductor module as the sixth embodiment of this invention, taken in a plane perpendicular to the left-right direction in FIG. 19.

FIG. 21 schematically shows in vertical cross section a power semiconductor module according to this embodiment, the cross section being taken perpendicular to the direction of flow of refrigerant through the channels (left-right direction in FIG. 19). In this embodiment, the resin blocks 250, 251, 252 seal chips between the corresponding upper and lower split heat spreaders 340, 341, 342 and 240, 241, 242, respectively. Each resin block has the areas of the upper and lower surfaces larger than the footprints of the upper and lower heat spreaders, and the upper and lower heat spreaders are buried in the associated resin block to at least a depth smaller than the width of each heat spreader. Consequently, the circumference of each heat spreader is almost entirely covered with the sealing resin so that the degree of contact between the split heat spreaders and the sealing resin can be improved.

Since the upper and lower surfaces of the resin block 250 extend beyond the peripheries of the upper and lower heat spreaders 340 and 240, those portions of the leads 26, 27, 28 extending from the upper and lower insulating substrates 18, 19 outward which lie between the upper and lower heat spreaders, can be fixed with the sealing resin.

Female screws may be formed by coiled-up wire thread insert process or nuts 30 may be embedded, in the upper and lower heat spreaders 340 and 240 prior to the assembly of the module. By so doing, the casings 14 and 24 are easily and securely attached to the heat spreaders 240 and 340 by inserting screws or bolts 29 from outside through holes bored in the casings 14 and 24 and threading them into the female screws or the nuts 30.

Since the sealing resin is divided into smaller resin blocks, thermal stress generated in the sealing resin can be reduced. Accordingly, the resin can be prevented from cracking due to thermal stress so that the reliability of sealing resin and therefore the reliability of the resultant semiconductor module can be improved.

Figure 24:
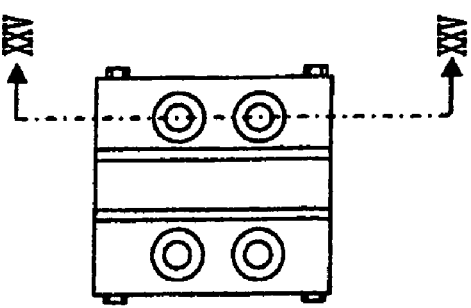
FIG. 24 schematically shows in lateral view the structure of refrigerant channels used for the power semiconductor module as the sixth embodiment of this invention.
Figure 25:
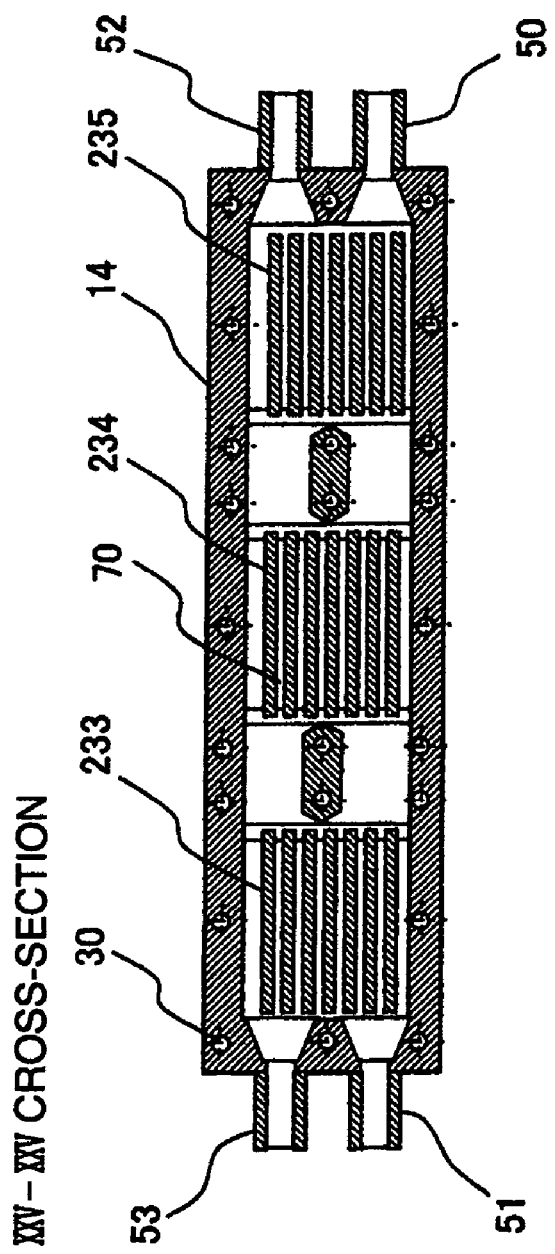
FIG. 25 is a cross section taken along line XXV-XXV in FIG. 24 showing in lateral view the structure of the casing.

FIGS. 22, 23, 24 and 25 schematically show an example of the structure of refrigerant flow channels according to this embodiment. FIG. 22 is a plan view of a casing 14 forming the lower channels, as seen from top, and FIG. 23 is a cross section taken along line XXIII-XXIII in FIG. 22. A casing 24 forming the upper channels has substantially the same structure and therefore the figure thereof is omitted. FIGS. 24 and 25 schematically show the structure of the channels as assembled in the power semiconductor module according to this embodiment. FIG. 25 is a cross section taken along line XXV-XXV in FIG. 24 showing side view (this cross section is parallel with the plan shown in FIG. 22).

The casing 14 has a space between a plate (inner plate) to which a heat spreader is attached and another plate (outer plate) that is opposite to the inner plate, the space serving as a refrigerant chamber accommodating the refrigerant flow channels. As shown in FIGS. 22 and 23, three openings 420, 421, 422 corresponding to the three divided heat spreaders 240-242 (see FIG. 19) are cut in the inner plate of the casing 14. The fins 233-235 provided on the heat spreaders 240-242 are set in the openings 420-422 (see FIGS. 19, 24 and 25). The fins are disposed in the refrigerant chamber in such a manner that the interstices between the fins are parallel with the direction of flow of refrigerant, so that the fins may be integrated with the casing 14 to form refrigerant flow channels. Grooves 400-402 for O-rings are cut along the peripheries of the openings 420-422, and O-rings 410-412 are set in the grooves 400-412 to seal the interface between the heat spreader and the casing 14.

The outer plate of the casing 14 is raised at positions corresponding to the openings 400-402 toward the fins set in the openings so that the refrigerant chamber is narrow where there are fins and relatively broader where there are not fins. Accordingly, the outer plate has depressions 500 as seen from inside the refrigerant chamber at the positions between the openings 400-402 where the fins are set. With this structure, since the distance between the free ends of the fins and the outer plate is small at the positions of the refrigerant chamber where there are fins accommodated, refrigerant flows smoothly through the interstices between the fins. Besides, at positions where no fins are disposed in the refrigerant chamber, the flow path resistance which is otherwise increased due to narrow flow path, can be prevented from being increased. The connection among the refrigerant chambers may be the same as shown in the first embodiment of this invention shown in FIGS. 7 and 8.

Since the structure of this embodiment enables power semiconductor chips having high density heat generation to be cooled with high efficiency, the size of a power semiconductor chip or the overall size of a power semiconductor module can be reduced, and the high reliability of the resin blocks can be secured.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A power semiconductor module comprising
power semiconductor chips;
first insulating substrates having metal electrode layers disposed on their surfaces, the metal electrode layers being joined to first principal surfaces of the power semiconductor chips;
second insulating substrates having metal electrode layers disposed on their surfaces, the metal electrode layers being joined to second principal surfaces of the power semiconductor chips;
a first heat spreader disposed on rear surfaces of the first insulating substrates;
a second heat spreader disposed on rear surfaces of the second insulating substrates; and
a resin member for sealing the power semiconductor chips, and the first and second insulating substrates therein,
wherein the first and second insulating substrates have rear metal layers disposed on their rear surfaces, respectively; one surface of the first heat spreader is joined to the rear metal electrodes of the first insulating substrates by using brazing, to achieve connection between the first heat spreader and the first insulating substrates; one surface of the second heat spreader is joined to the rear metal electrodes of the second insulating substrates by using brazing, to achieve connection between the second heat spreader and the second insulating substrates; and heat radiating fins are provided on the other surface of at least one of the first and second heat spreaders.

2. A power semiconductor module as claimed in claim 1, wherein for each power semiconductor chip a spacer of sufficiently conductive material is provided between the power semiconductor chip and one of the first and second insulating substrates; and the spacer is disposed on that surface of the power semiconductor chip on which fewer number of chip electrodes of the power semiconductor chip rest, and the spacer is joined to the chip electrodes located at both ends of the spacer and the metal electrode of the insulating substrate.

3. A power semiconductor module as claimed in claim 1, further comprising
a first casing covering the heat radiating surface of the first heat spreader for forming a first refrigerant chamber on the heat radiating surface; and
a second casing covering the heat radiating surface of the second heat spreader for forming a second refrigerant chamber on the heat radiating surface, wherein the contact interface between the first casing and the first heat spreader and the contact interface between the second casing and the second heat spreader, are sealed with O-rings.

4. A power semiconductor module as claimed in claim 3, wherein each of the first and second casings is externally provided with at least two ports serving as refrigerant inlets and outlets; and some ports of the first casing are connected with some ports of the second casing via external connecting tubing so that the refrigerant chambers of the first casing are connected in series with the refrigerant chambers of the second casing.

5. A power semiconductor module as claimed in claim 3, wherein at least one of the first and second casings forms at least two refrigerant chambers separated from each other; at least two ports serving as refrigerant inlet and outlet are externally provided on each of the refrigerant chamber; and the mutual connections between the refrigerant chambers can be changed by means of external connection tubing connected with the respective ports.

6. A power semiconductor module as claimed in claim 3, wherein at least one of the first and second casings forms a fold-back refrigerant chamber accommodating refrigerant flow channels.

7. A power semiconductor module as claimed in claim 1, wherein each of the power semiconductor chips is fabricated on a semiconductor substrate consisting mainly of silicon carbide.

8. A power semiconductor module as claimed in claim 1, wherein each of the power semiconductor chips is fabricated on a semiconductor substrate consisting mainly of gallium nitride.

9. A power semiconductor module as claimed in claim 1, wherein the resin member is divided into plural constituent resin members in such a manner that each constituent resin member seals therein one of the power semiconductor chips, and the first and second insulating substrates associated therewith.

10. A power semiconductor module as claimed in claim 9, wherein the first heat spreader is divided into first plural constituent heat spreaders corresponding to the plural constituent resin members and the second spreader is divided into second plural constituent heat spreaders corresponding to the plural constituent resin members.

11. A power semiconductor module as claimed in claim 10, wherein the first and second constituent heat spreaders are embedded in the corresponding constituent resin members at least to a depth equal to a part of their thickness.

12. A power semiconductor module as claimed in claim 10, further comprising a first casing which covers the heat radiating surfaces of the first constituent heat spreaders and forms a first refrigerant chamber shared by the first constituent heat spreaders; and a second casing which covers the heat radiating surfaces of the second constituent heat spreaders and forms a second refrigerant chamber shared by the second constituent heat spreaders, wherein the interfaces between the first casing and the first constituent heat spreaders and the interfaces between the second casing and the second constituent heat spreaders, are sealed by O-rings.

13. A power semiconductor module as claimed in claim 12, wherein the first and second constituent heat spreaders have female screws previously formed therein; the first casing is joined to the first constituent heat spreaders by means of male screws or bolts inserted through the holes bored in the first casing and threaded into the female screws; and the second casing is joined to the second constituent heat spreaders by means of male screws or bolts inserted through the holes bored in the second casing and threaded into the female screws.

14. A power semiconductor module as claimed in claim 12, wherein each of the first and second casing has an inner plate to which the first or second constituent heat spreader is attached and an outer plate disposed opposite to the inner plate with the refrigerant chamber interposed in between; and the outer plate is concaved toward the internal of the refrigerant chamber at the places in the refrigerant chamber where the heat radiating fins are located, to reduce the thickness of the refrigerant chamber there while the thickness of the refrigerant chamber is increased at the places before and after the heat radiating fins in the refrigerant chamber.

15. A power semiconductor module comprising
plural power semiconductor chips;
first insulating substrates having metal electrode layers disposed on their surfaces, the metal electrode layers being joined to first principal surfaces of the power semiconductor chips;
second insulating substrates having metal electrode layers disposed on their surfaces, the metal electrode layers being joined to second principal surfaces of the power semiconductor chips;
a first heat sink disposed on rear surfaces of the first insulating substrates;
a second heat sink disposed on rear surfaces of the second insulating substrates; and
a resin member for sealing the power semiconductor chips, and the first and second insulating substrates therein,
wherein the first and second insulating substrates have rear metal layers disposed on their rear surfaces, respectively; the first heat sink is joined to the rear metal electrodes of the first insulating substrates by using brazing, to achieve connection between the first heat sink and the first insulating substrates; the second heat sink is joined to the rear metal electrodes of the second insulating substrates by using brazing, to achieve connection between the second heat sink and the second insulating substrates; and at least one of the first and second heat sinks has a micro channel structure.

16. A power semiconductor module as claimed in claim 15, wherein each of the power semiconductor chips is fabricated on a semiconductor substrate consisting mainly of silicon carbide.

17. A power semiconductor module as claimed in claim 15, wherein each of the power semiconductor chips is fabricated on a semiconductor substrate consisting mainly of gallium nitride.

18. A power semiconductor module comprising
power semiconductor chips;
first insulating substrates having metal electrode layers disposed on their surfaces, the metal electrode layers being joined to first principal surfaces of the power semiconductor chips;
second insulating substrates having metal electrode layers disposed on their surfaces, the metal electrode layers being joined to second principal surfaces of the power semiconductor chips;
a heat spreader disposed on rear surfaces of the first insulating substrates;
heat pipes with the first ends thereof connected with rear surfaces of the second insulating substrates and the second ends thereof connected with the heat spreader; and
a resin member for sealing the power semiconductor chips, and the first and second insulating substrates therein,
wherein the first and second insulating substrates have rear metal layers disposed on their rear surfaces, respectively; the heat spreader is joined to the rear metal electrodes of the first insulating substrates by using brazing, to achieve connection between the heat spreader and the first insulating substrates; and the first ends of the heat pipes are joined to the rear surfaces of the second insulating substrates by using brazing, to achieve connection between the heat pipes and the second insulating substrates, and the second ends of the heat pipes are joined to the heat spreader by using brazing.

19. A power semiconductor module as claimed in claim 18, wherein the direction in which the leads extend from the first and second insulating substrates and out of the resin member is different from the direction in which the heat pipes extend from the second insulating substrates.

20. A power semiconductor module as claimed in claim 18, wherein each of the power semiconductor chips is fabricated on a semiconductor substrate consisting mainly of silicon carbide.

21. A power semiconductor module as claimed in claim 18, wherein each of the power semiconductor chips is fabricated on a semiconductor substrate consisting mainly of gallium nitride.

* * * * *